United States Patent
Van Houdt et al.

(10) Patent No.: US 10,418,377 B2
(45) Date of Patent: Sep. 17, 2019

(54) THREE-DIMENSIONAL NON-VOLATILE SEMICONDUCTOR MEMORY DEVICE HAVING REPLACEMENT GATE

(71) Applicant: IMEC VZW, Leuven (BE)

(72) Inventors: Jan Van Houdt, Bekkevoort (BE); Pieter Blomme, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/855,692

(22) Filed: Dec. 27, 2017

(65) Prior Publication Data

US 2018/0233512 A1 Aug. 16, 2018

(30) Foreign Application Priority Data

Dec. 27, 2016 (EP) ..................................... 16206998

(51) Int. Cl.
H01L 27/11582 (2017.01)
H01L 21/28 (2006.01)
(Continued)

(52) U.S. Cl.
CPC .. H01L 27/11582 (2013.01); H01L 21/02636 (2013.01); H01L 21/28273 (2013.01);
(Continued)

(58) Field of Classification Search
CPC ......... H01L 27/11582; H01L 21/28282; H01L 27/11568; H01L 29/66545;
(Continued)

(56) References Cited

U.S. PATENT DOCUMENTS

2012/0256247 A1* 10/2012 Alsmeier .............. H01L 21/764
257/319
2013/0270623 A1 10/2013 Suzuki et al.
(Continued)

FOREIGN PATENT DOCUMENTS

WO WO 2015/105709 A1 7/2015

OTHER PUBLICATIONS

"Semiconductor metrology beyond 22nm: 3D memory metrology", Solid State Technology Insights for Electronics Manufacturing, http://electroig.com/blog/2012/02/semiconductormetrologybeyond22nm3dmemorymetrology/, as printed Feb. 22, 2016, 5 pages.

*Primary Examiner* — Khiem D Nguyen
(74) *Attorney, Agent, or Firm* — Knobbe, Martens, Olson & Bear LLP

(57) ABSTRACT

The disclosed technology relates generally to semiconductor devices and more particularly to three dimensional semiconductor memory devices, such as vertical three dimensional non-volatile memory devices. In one aspect, a method of fabricating a memory device comprises providing, on a substrate, an alternating stack of control gate layers and dielectric layers. The method additionally includes forming a memory block. comprising forming at least one memory hole through the alternating stack, where the at least one memory hole comprises on its sidewalls a stack of a programmable material, a channel material and a dielectric material, thereby forming at least one memory cell. The method additionally comprises removing a portion of the alternating stack to form at least one trench, where the at least one trench forms at least part of a boundary of the memory block. The method additionally comprises partially removing the control gate layers exposed at a sidewall of the at least one trench, thereby forming recesses in the control gate layers. The method further comprises filling the
(Continued)

recesses with an electrically conductive material, thereby forming electrically conductive plugs. In another aspect, a device formed using the method is also provided.

8 Claims, 7 Drawing Sheets

(51) Int. Cl.
    *H01L 21/02*     (2006.01)
    *H01L 27/11521*     (2017.01)
    *H01L 21/768*     (2006.01)
    *H01L 29/10*     (2006.01)
    *H01L 21/3213*     (2006.01)
    *H01L 29/66*     (2006.01)
    *H01L 27/11556*     (2017.01)
    *H01L 27/11568*     (2017.01)
    *H01L 21/311*     (2006.01)
    *H01L 45/00*     (2006.01)
    *H01L 27/24*     (2006.01)
    *H01L 27/1159*     (2017.01)
    *H01L 27/11597*     (2017.01)

(52) U.S. Cl.
    CPC .. *H01L 21/28282* (2013.01); *H01L 21/31111* (2013.01); *H01L 21/32133* (2013.01); *H01L 21/76802* (2013.01); *H01L 21/76877* (2013.01); *H01L 21/76897* (2013.01); *H01L 27/11521* (2013.01); *H01L 27/11556* (2013.01); *H01L 27/11568* (2013.01); *H01L 27/2463* (2013.01); *H01L 27/2481* (2013.01); *H01L 29/1037* (2013.01); *H01L 29/66545* (2013.01); *H01L 45/04* (2013.01); *H01L 45/06* (2013.01); *H01L 45/085* (2013.01); *H01L 45/124* (2013.01); *H01L 45/1233* (2013.01); *H01L 27/1159* (2013.01); *H01L 27/11597* (2013.01); *H01L 27/249* (2013.01)

(58) Field of Classification Search
    CPC ......... H01L 21/76877; H01L 21/02636; H01L 27/11556; H01L 27/11521; H01L 29/1037; H01L 27/11597; H01L 27/1159
    See application file for complete search history.

(56) References Cited

U.S. PATENT DOCUMENTS

| | | | |
|---|---|---|---|
| 2014/0061770 A1* | 3/2014 | Lee | H01L 29/66825 257/324 |
| 2014/0361360 A1 | 12/2014 | Alsmeier et al. | |
| 2015/0041879 A1* | 2/2015 | Jayanti | H01L 21/28282 257/324 |
| 2015/0079742 A1* | 3/2015 | Pachamuthu | H01L 27/11551 438/268 |
| 2015/0179661 A1 | 6/2015 | Huo et al. | |
| 2015/0249092 A1* | 9/2015 | Sakui | H01L 29/7889 438/268 |
| 2016/0043096 A1* | 2/2016 | Blomme | H01L 21/02592 438/261 |
| 2018/0138193 A1* | 5/2018 | Zhang | H01L 27/11582 |

\* cited by examiner

THREE-DIMENSIONAL NON-VOLATILE SEMICONDUCTOR MEMORY DEVICE HAVING REPLACEMENT GATE

CROSS-REFERENCE TO RELATED APPLICATIONS

This application claims foreign priority to European Patent Application No. 16206998.3, filed on Dec. 27, 2016, the content of which is incorporated by reference herein in its entirety.

BACKGROUND

Field

The disclosed technology relates generally to semiconductor devices and more particularly to three dimensional semiconductor memory devices, such as vertical three dimensional non-volatile memory devices.

Description of the Related Technology

Recently, ultra-high density storage devices have been proposed. Some of the proposed devices are formed using a process architecture comprising a vertical channel three-dimensional (3D) stacked memory structure. One of the process architectures is referred to in the relevant industry as Bit Cost Scalable (BiCS) architecture. Some 3D NAND stacked memory devices are formed using a process architecture comprising a stack of alternating conductive and dielectric layers.

However, various process architectures for forming 3D NAND stacked memory devices take into account a fundamental trade-off: in order to maximize the density, one should share as many gates of memory cells in a given word plane as possible. In this regard, some process architectures use a stack of alternating polysilicon layers and dielectric layers, which are sometimes referred to as a polysilicon-oxide-polysilicon-oxide (POPO) approach, where P stands for polysilicon and O stands for silicon oxide (e.g., $SiO_2$). However, one of the main drawbacks of the POPO approach is the relatively high resistance of the word lines formed by the alternating polysilicon layers. Alternatively, some process architectures contemplate using a metal gate electrode instead of a polysilicon gate electrode. This approach is sometimes referred to as a metal-oxide-metal-oxide (MOMO) approach, where M stands for metal and O for silicon oxide (e.g., $SiO_2$). However, the MOMO approach has been hampered because of the relatively high stress in the stack.

Another approach is to apply replacement gate processes in which a sacrificial gate layer, e.g., a layer of silicon nitride, is used to form the alternating stack. Afterwards this sacrificial gate layer is replaced with the desired gate electrode material. This so-called nitride-oxide-nitride-oxide (NONO) approach however, where N stands for silicon nitride (e.g., $Si_3N_4$) and O for silicon oxide (e.g., $SiO_2$), sometimes limits the width of the word plane to a few, e.g., four, cell strings. Such replacement gate processes have limited capability in filling the cavities of the removed replacement gate layer. This limited filling capacity can decrease the memory density because slits, through which the desired gate electrode material is provided, are formed every few rows. In addition, these slits have to go all the way down to the substrate which results in a large area. US2015/0079742 (see FIG. 6) discloses such a vertical channel-type three-dimensional semiconductor devices having replacement gates.

Thus, there is a need for novel and improved three-dimensional non-volatile memory devices, and fabrication methods thereof, with a reduced resistance-capacitor time constant of the word line, but still having a high memory density.

SUMMARY OF CERTAIN INVENTIVE ASPECTS

It is an object of embodiments of the disclosed technology to provide three-dimensional non-volatile memory devices and fabrication methods thereof.

The above objective is accomplished by a method and device according to the disclosed technology.

In a first aspect, the disclosed technology provides a method of fabricating a memory device. The method comprises:

providing, on a substrate, an alternating stack of control gate layers and dielectric layers;

forming a memory block, comprising at least one memory hole through the stack, the at least one memory hole comprising on its sidewalls a stack of a programmable material, a channel material and a dielectric material, thereby forming at least one memory cell;

removing a portion of the stack to form at least one trench, wherein the trench forms at least part of a boundary of the memory block;

partially removing the control gate layers exposed at a sidewall of the at least one trench thereby forming recesses in the control gate layers; and filling the recesses with an electrically conductive material, e.g., metal, thereby forming electrically conductive plugs, e.g., metal plugs.

It is an advantage of embodiments of the disclosed technology that the stack can be kept with a relatively high density while also reducing the RC load of the wordlines/planes.

It is an advantage of embodiments of the disclosed technology that a high density stack is provided, which can be enabled with fast access speed by using replacement gates, in particular for instance partially metallic gates.

It is an advantage of embodiments of the disclosed technology that instead of providing a replacement gate, e.g., e.g., a metal gate, in every cell separately, requiring slits at many points in the array, the gate replacement process is only done at the edge of an active memory device, e.g., at the edge of a larger memory block.

It is an advantage of embodiments of the disclosed technology that the number of shared wordlines in one memory block can be chosen to get the best trade-off between performance and area for a given application (storage-class memory (SCM), NAND, etc.).

It is an advantage of embodiments of the disclosed technology that an alternative is provided for using silicided polysilicon (e.g., a polysilicon gate electrode having a metal silicide on upper and lower surfaces) as control gate electrode, which can require high thermal budgets (e.g., thermal budgets exceeding about 650° C.).

In embodiments of the disclosed technology, filling the recesses may comprise: filling the at least one trench and the recesses with an electrically conductive material, and removing the electrically conductive material in the trench while maintaining the electrically conductive material in the recesses.

In embodiments of the disclosed technology, forming a memory block comprises forming at least one memory hole through the stack with sidewalls substantially perpendicular to a main surface of the substrate. In alternative embodiments, forming a memory block comprises forming at least one V-shaped memory hole through the stack.

In embodiments of the disclosed technology, the method comprises removing a portion of the stack to form at least one trench, wherein the at least one trench forms the boundary of the memory block.

In a method according to embodiments of the disclosed technology, partially removing the control gate layers comprises under-etching the control gate layers via a selective etch.

In a method according to embodiments of the disclosed technology, filling the recesses with an electrically conductive material comprises filling the recesses with an electrically conductive material different from the material of the control gate layers. In embodiments of the disclosed technology, filling the recesses with an electrically conductive material may be filling the recesses with at least one of tungsten, tungsten nitride, tantalum, tantalum nitride, titanium and titanium nitride. In particular embodiments of the disclosed technology, the control gate layers are semiconductor layers, and the conductive material is metal.

In a second embodiment, the disclosed technology provides vertical channel type, three dimensional semiconductor memory device, comprising: a memory block comprising at least one memory hole provided in a stack of alternating layers of control gate layers and dielectric layers, filled with a plurality of materials forming at least one memory cell; at least one trench, forming part of a boundary of the memory block, wherein the control gate layers have recesses at the sidewalls of the at least one trench, being filled with an electrically conductive material. The electrically conductive material is different from the material of the control gate layers. In particular embodiments of the disclosed technology, the control gate layers are semiconductor layers, and the conductive material is a metal.

In a memory device according to embodiments of the disclosed technology, the at least one memory hole may have a pillar shape having a circular cross section when viewed in a direction substantially perpendicular to a main surface of the substrate, e.g., when viewed from above. In alternative embodiments, the at least one memory hole may be a V-shaped trench. It is an advantage of embodiments of the disclosed technology that the V-shaped trench in a 3D memory can be interconnected in a much more relaxed way (pitch wise). This will also reduce periphery.

In a memory device according to embodiments of the disclosed technology, the trench may form the boundary of the a memory block.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
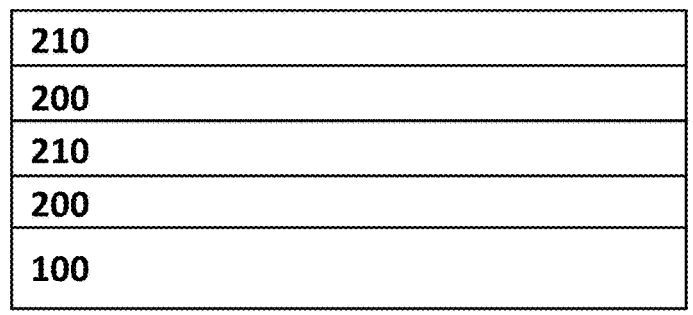
FIG. 1(a)-FIG. 1(f) are schematic side cross-sectional views of intermediate structures illustrating steps of a method of making a three-dimensional memory device according to embodiments.
Figure 1:
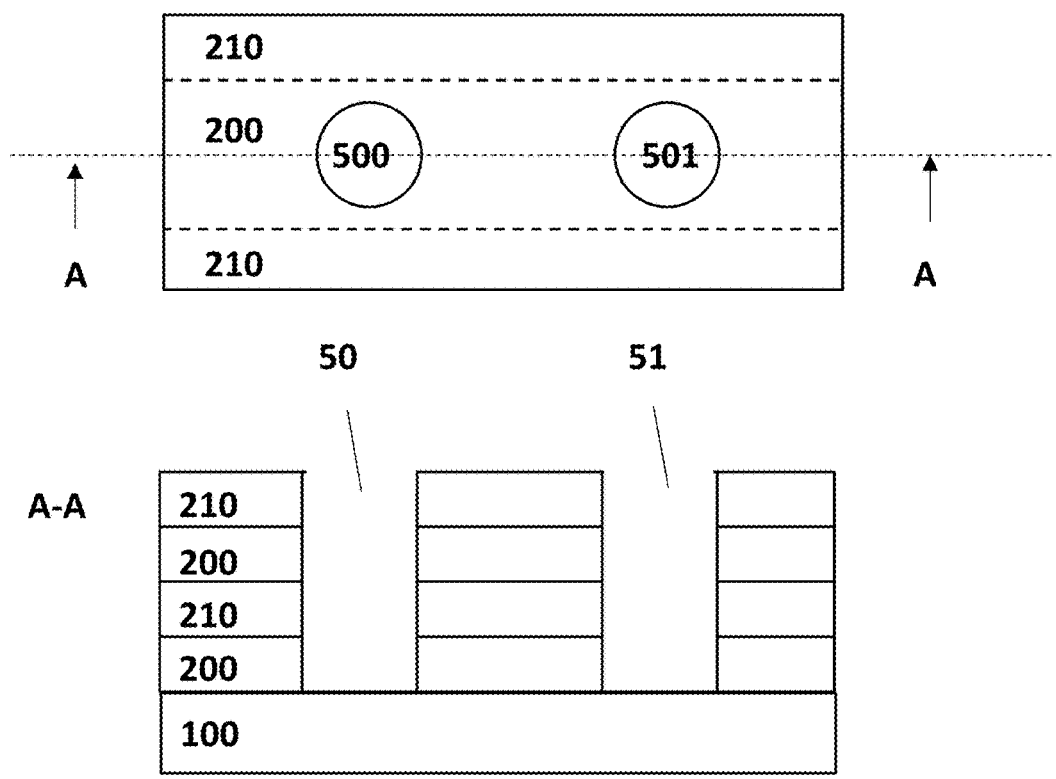
Figure 1:
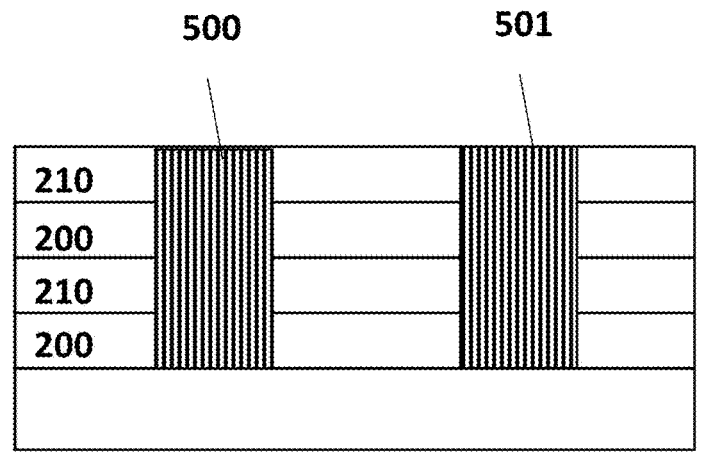
Figure 1:
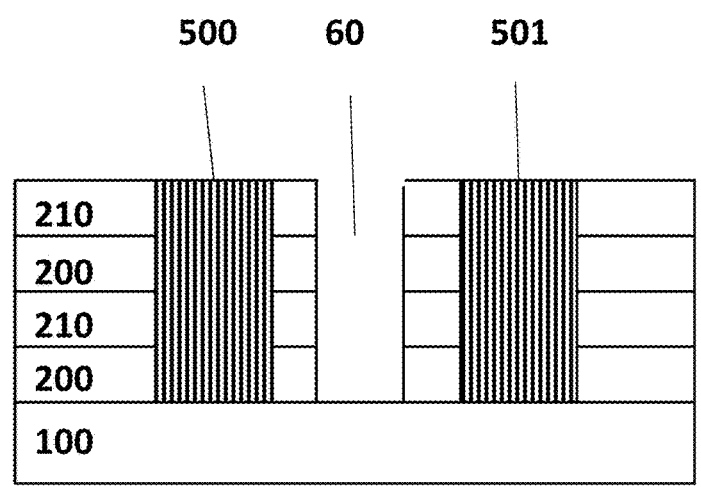
Figure 1:
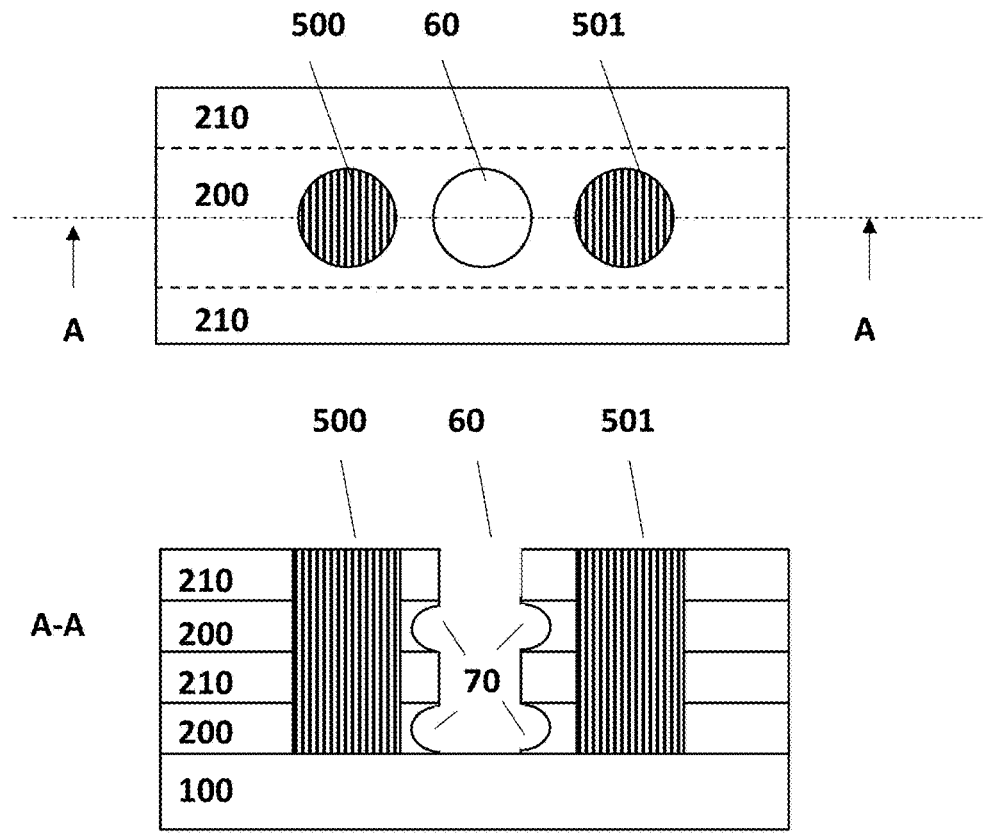
Figure 1:
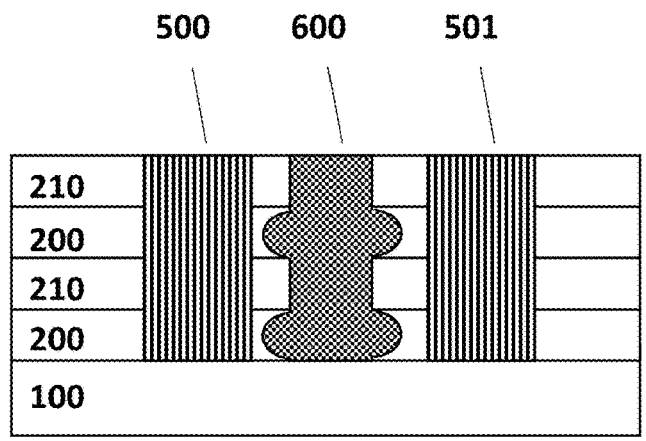

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is to be understood that embodiments of the invention may be practiced without these specific details. In other instances, well-known methods, structures and techniques have not been shown in detail in order not to obscure an understanding of this description.

As used herein, when the terms control gate and word line are used in the context of floating gate-based or floating charge-based non-volatile memory devices, the terms may be used interchangeably to refer to the same electrically conductive entity. However, it will be understood that, physically, a control gate may be considered to form a portion of a word line located adjacent to and controlling one NAND cell in an array of NAND cells. That is, a word line can control a plurality of NAND cells in the array. Thus, the word line may be considered to physically form a portion of the electrically conductive entity which connects the control gates. However, it should be understood that the word line and its control gate portions may be (but do not need to be) formed during one and the same step, and may comprise the same one or more electrically conductive layers as will be described below.

Vertical channel-type semiconductor memory devices such as Bit Cost Scalable (BiCS) NAND memory and U-shaped (i.e., "pipe-shaped") BiCS (p-BiCS) were developed as ultra-high density storage devices. However, these BiCS and p-BiCS 3D NAND architectures suffer from relatively high control gate/word line resistances and capacitances. These resistances and capacitances reduce the cell efficiency and increase the power consumption of the memory device.

Embodiments of the disclosed technology provide methods and devices to overcome these disadvantages, by replacing a portion or a part of the original control gate layer material by different conductive material, e.g., by replacing polysilicon gate electrodes by metal gate electrodes. This replacement is done by providing slit trenches around a block of the active memory area, whereby the block contains a number of cell strings. These slit trenches enable removing a part of the control gate layer, e.g., a polysilicon layer, exposed on the sidewalls of the slit trench. This removal can be done through an undercut process. Afterwards, the array is finalized by filling the slit trenches with a conductive material, e.g., a metal, with a conventional CVD process, which replaces the removed part of the control gate layer and fills the slit trench. The conductive material has electrical resistivity that may be lower than that of polysilicon, such that the overall electrical resistance of the control gate is lowered compared to control gates formed entirely of polysilicon. It is an advantage of the partial gate replacement method of the disclosed technology that less material is removed and needed for the formation of the control gate electrodes. Embodiments of the disclosed technology provide a novel interconnect scheme which can be used for any vertical memory concept, e.g., 3D floating gate configuration with plugs as cells or with 3D V-shaped cells according to embodiments of the disclosed technology. More specifically, embodiments of the disclosed technology can be used as a dense gate-level interconnect technique.

FIG. 1(a)-FIG. 1(f) illustrate schematic cross-sections of intermediate structures at various stages of fabrication of a vertical channel-type three-dimensional semiconductor device having a partial replaced control gate electrode, according to embodiments of the disclosed technology. In embodiments, a substrate 100 having a major surface is provided. The intermediate structure illustrates a stack of alternating layers of a first material layer 200 and a second material layer 210 formed over the major surface of the substrate 100. Although in these drawings only four alternating layers are provided, it will be appreciated that more or less numbers (e.g., 2, 8, 16, 32, 64, 128, 256, etc.) of layers can be provided. In some embodiments, the final top layer of the stack, i.e., the layer furthest from the substrate 100, is a layer of the first material layer 200.

The substrate 100 may include any underlying material or materials that may be used, or upon which a device may be formed. In embodiments of the disclosed technology, this substrate may include a semiconductor substrate, such as for instance a substrate of monocrystalline semiconductor material, such as monocrystalline silicon, IV-IV compounds such as silicon-germanium or silicon-germanium-carbon, III-V compounds, II-VI compounds, epitaxial layers over such substrates. In alternative embodiments, the substrate may include or be made of any other semiconductor or non-semiconductor material, such as a silicon oxide, glass, plastic, metal or ceramic substrate. The term "substrate" is thus used to define generally the elements for layers that underlie a layer or portions of interest, in particular a memory device. The substrate 100 may include integrated circuits fabricated thereon, such as driver circuits for a memory device which is to be formed on the substrate 100.

The first and second material layers 200 and 210 may be alternatingly deposited over the substrate 100 by any suitable deposition method, such as sputtering or physical vapor deposition (PVD), chemical vapor deposition (CVD), plasma-enhanced chemical vapor deposition (PECVD), molecular beam epitaxy (MBE), atomic layer deposition (ALD), spin-on dielectric (SOD) process, etc. Preferably, the first material layer 200 is suitable for use as a control gate and is referred to as control gate layer. Suitable materials include, but are not limited to, semiconductors, e.g., group IV semiconductors, such as silicon (e.g., polysilicon), silicon germanium, silicon carbide, etc. The semiconductor may be p-type or n-type doped and may have a doping concentration between about $10^{17}$ cm$^{-3}$ and about $10^{21}$ $cm^{-3}$. This first material layer 200 may be patterned to form the control gates controlling the cell, in which case these control gates are formed as parallel stripes as shown in the top view of FIG. 1(b) of the intermediate structure. However, the first material layer 200 may remain un-patterned and form a plane being a common control gate to all memory cells at the level of corresponding first material layer 200, according to some embodiments. The second material layer 210 electrically isolates the first material layers 200, at least from each other. The second material layers 210 may comprise a dielectric or insulating material (e.g., silicon oxide, silicon nitride, etc.) that may be selectively removable, e.g., by etching, with respect to the first material layer 200.

After alternatingly depositing the layers 200, 210 onto the substrate 100, the stack may be etched to form at least one memory hole 50, 51, as illustrated in FIG. 1(b). The bottom figure of FIG. 1(b) is the cross sectional side view A-A of the top view depicted above. The memory hole punches through the stack of layers 200, 210, thereby defining cavities or openings where the vertical channel of the memory string will be formed at later stages. Vertical NAND strings may be formed in the memory hole 50, 51, as illustrated in FIG. 1(c), by filling the thus formed hole with layers of material to form at each first material layer 200 a memory cell. For example, a series of conformal deposition steps of a programmable material 120, a conductive channel material 150, and a filler material 220 in the memory hole 50, 51 will result in a memory cell string having a vertical channel. Conformal deposition techniques include, but are not limited to, atomic layer deposition (ALD) and chemical vapor deposition (CVD). The layers 200 of the first material serve as control gate at the different levels within the memory string, each layer controlling the memory cells at that level. In some embodiments, the layer of programmable material 120 can include or be a ferro-electric layer or a stack of ferro-electric layers, when the embodiments are implemented in a ferro-electric memory. However, embodiments are not so limited and can be implemented in various other non-volatile memory devices. For example, the layer of programmable material 120 can be a stack of insulating/conductive/insulating layers when embodiments are implemented in a floating gate memory. In a specific embodiment, the programmable material 120 may be a resistive-switching material or a phase change material, such that embodiments can be implemented in a 3D resistive-switching random access memory (3D RRAM) device or 3D PCM device, respectively, or other 3D resistive switching-based memory devices. The channel material 150 may comprise lightly doped p-type or n-type, e.g., with a doping level below, e.g., $10^{17}$ $cm^{-3}$, semiconductor material, e.g., polysilicon. An n-channel device, having n-type doped channel material, is preferred since it is easily connectable with n+junctions, e.g., source and drain n+doped regions having a doping concentration between $10^{17}$ $cm^{-3}$ and $10^{21}$ $cm^{-3}$, located at the opposite ends of each channel in case no pipe-line is formed. However, a p-channel device, having p-type doped channel material, may also be used. Other semiconductor materials, e.g., Si, SiGe, SiC, Ge, III-V, II-VI, etc., may also be used.

To reduce the resistances and capacitances of the word lines or planes, part of the material of the word line (or plane) is replaced by a more conductive material, such as a metal or a metallic compound.

To achieve this end, an slit trench 60 is formed, as illustrated in FIG. 1(d) for a slit 60 having a circular cross-section. These slit trenches 60 allow removal of the gate electrode material 200 exposed in the sidewalls of the slit trench 60, as illustrated in FIG. 1(e). The bottom figure of FIG. 1(e) is a cross sectional side view A-A of the top view depicted above. In particular embodiments, etching a part of the control gate layer is enabled by using an undercut etch process, wherein an anisotropic etchant is used. As a result, the sidewalls of the slit trenches 60 have a substantially toothed profile. It is to be noted, that only a portion of the control layer, e.g., polysilicon, is selectively removed during the etching and thus that the control layers are not considered to be sacrificial or sacrificial layers.

Still referring to FIG. 1(d), thus created recesses 70 in the sidewall of the slit 60 can then be filled with a conductive material different from the material of the control gate layer, for instance with a metal or a metallic material having a higher conductivity compared to the doped polysilicon material of the first material layer 200. The first material layer 200, typically polysilicon, exposed in the slit trenches 60 is thus partially removed thereby creating recesses or cavities 70 in-between the second material layers 210 adjacent to the slit trenches. At least the recesses 70 are filled with the replacement material. One can fill the slit 60 with this replacement material, e.g., metal or a stack of metal layers, thereby filling the recesses 70, as illustrated by FIG. 1(f). An electrically conductive material is provided at least in the recess 70. The electrically conductive material may be a metal having a lower electrical resistivity compared to doped polysilicon, which may compatible with the CVD process and the control layer (e.g., polysilicon). Examples of such materials may be, without being limited thereto, tungsten, titanium, tantalum, tantalum nitride, titanium nitride or a combination of two more of these metals. The electrically conductive material may thus locally form electrically conductive control gate electrode plugs. The electrically conductive control gate electrode material is made to partially or completely fill the trenches 60, and to completely fill the recesses 70 whereby the as-deposited gate electrode material 200 remains in contact with the filled memory holes 500, 501, e.g., the V-grooved channel 500, 501.

Figure 2:
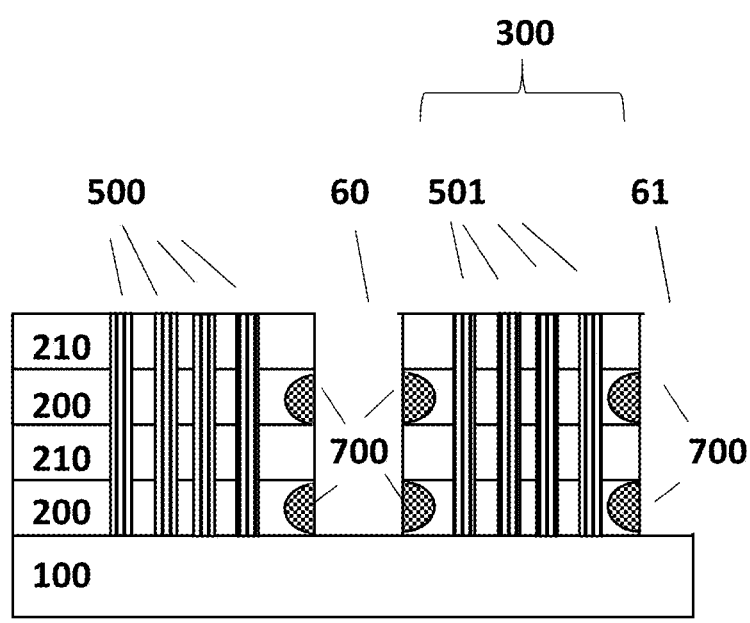
FIG. 2 shows a schematic cross-section of a device according to embodiments.

Then the electrically conductive material, e.g., a metal, in the slit 60 in excess of the recess 70 is removed. Thus, after etching back the conductive material, e.g., a metal, the holes 70 in control gate layers 200 are filled with the electrically conductive material, e.g., metal, thereby creating an electrically conductive plug, e.g., a metal plug, at the exposed end of a control gate plane or control gate stripes, as illustrated by FIG. 2. In the illustrated embodiment, the slits 60 are spaced apart by 4 strings 501. It will be appreciated that, for relatively higher memory density, the spatial frequency of the slit 60 should be relatively low. The larger the number of memory holes 50, 51 (or memory strings 500, 501) between slits 60, the more dense the memory device remains. Typically this number of strings can be, e.g., 10 or more, 100 or more, 1000 or more, or a number in a range defined by any of these values. The memory blocks according to embodiments of this invention typically can have a number of strings higher than the state-of-the-art.

In the embodiments, illustrated with respect to FIGS. 1(a) to 1(f), the slit 60 punching through the stack of layers 200,201 had a circular cross-section, and thus form slit plugs. Such a slit 60 will not interrupt the word plane 200, or if the case, the word lines formed in the layers 200. The memory cells at a level remain contacted by the same word plane 200, or if the case, the word lines formed in the layers 200, after replacing part of the material 200 at that level.

However, embodiments are not so limited and the slit 60 can also be formed as a slit trench, optionally extending over the width of the word plane 200, or if the case, through the width of a word line formed in the layer 200. In particular embodiments, the slit trench 60 is a continuous trench, e.g., having a length running substantially perpendicularly to the plane of the drawing of FIG. 1(d), i.e., perpendicular to the pattern of control gate in layers 200. The slit trench 60 extends through the layers 200 and 210 substantially perpendicular to the major surface of the substrate 100. In embodiments, the slit trenches 60 may have different shapes, e.g., whereby a width of the trench in the plane of the drawing of FIG. 1(d) increases along the depth of the trench through the stack of layers 200, 210, or whereby the width of the trench is constant or decreases over the entire depth of the trench. Preferably, such grooved slit trenches 60 are used when the memory cell has a V-shaped vertical channel.

In particular embodiments of the disclosed technology, the at least one memory cell may have a V-shaped vertical channel. In the embodiments illustrated with respect to FIGS. 1(a) to 1(f) and FIG. 2, the vertical channel was formed in a plug 50, 51 having sidewalls perpendicular to the substrate 100. Alternatively, a vertical channel can be formed in an opening 50, 51 through the stack of layers 200, 210, having sloped sidewalls. Instead of forming a plug 50, 51 with a constant circular cross-section, a V-shaped trench 50, 51 may be provided as the at least one memory hole. As was done for the vertical channel with rectangular sidewalls, the opening 50 contains a sequence of a programmable material 120, a conductive channel material 150, and a filler material 220, as illustrated by FIG. 3.

Figure 3:
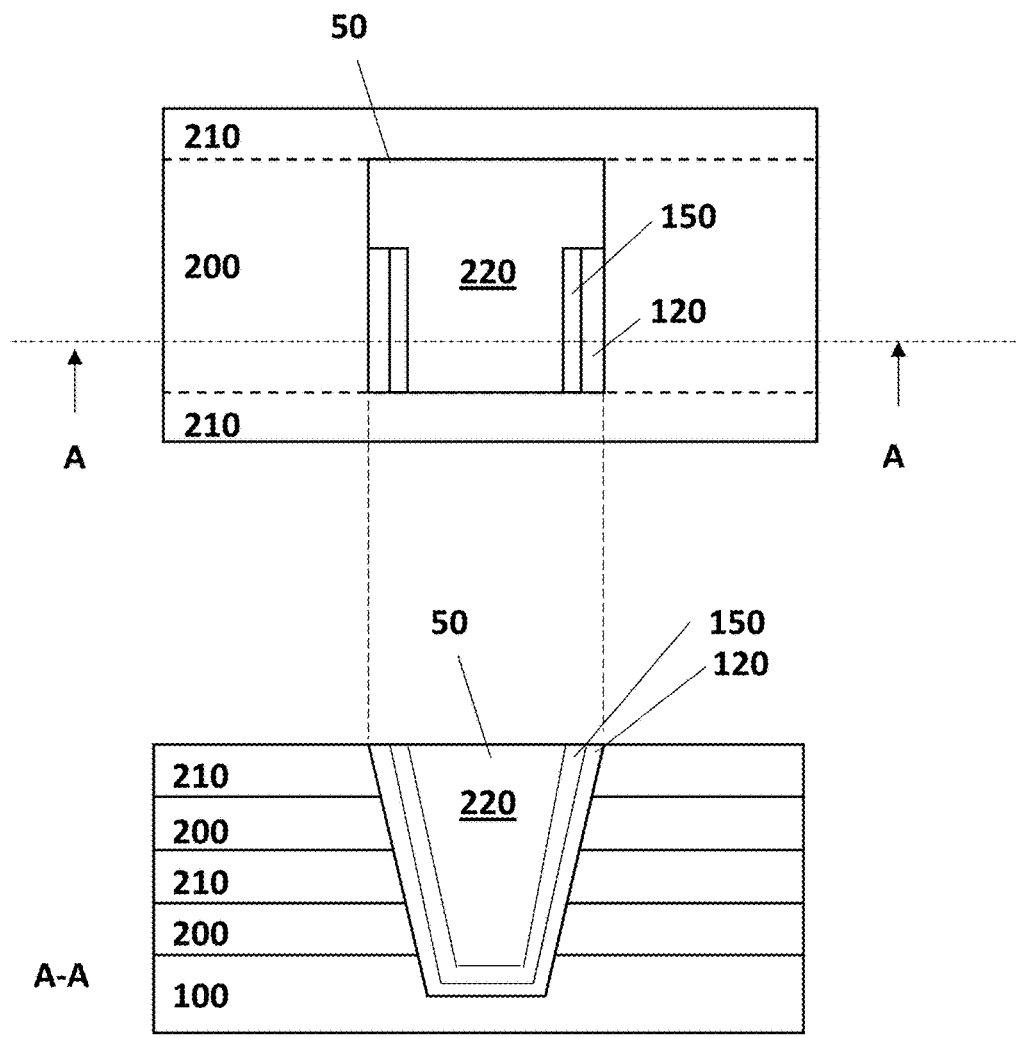
FIG. 3 shows a schematic cross-sectional view (bottom) and top view (top) illustrating a memory string, where the sidewalls of the vertical channel are sloped, according to embodiments.

After deposition of the layers 200 and 210 of the stack onto the substrate 100, in these embodiments the stack may be etched to form a V-shaped trench as illustrated in FIG. 3. The V-shaped channel or trench 400 can have a trapezoidal or triangular cross section. The V-shaped trench 400 comprises a horizontal portion, connecting the sloping portions, resulting in the V-shape. The horizontal portion may have a width or can be a point (where the vertical portions intersect in a sharp tip), depending on whether a trapezoidal or triangular cross section is provided. When viewed from above, the V-shaped channel has a cross section which decreases in area towards the substrate. The sloping portions of the V-shaped trench of the V-shaped channel are thus not substantially perpendicular to a major surface of the substrate and form an angle therewith. In embodiments, the cross-sectional shape of the V-shaped channel, substantially parallel with a main surface of the substrate 100, may form any suitable shape, for example it may be rectangular or circular. The V-shaped trench of the V-shaped channel 400 may be provided by anisotropically etching the stack formed by the layers 200, 210 on the substrate through a masking material. The etching creates a pit or cavity with flat sloping sidewalls and a flat bottom, the sloped sidewalls may comprise an angle with respect to a major surface of the substrate of 60° to 85°, which is substantially different from the prior art which aims at substantially vertical sidewalls having an angle of at least 89°. The pit or cavity, when etched to completion, displays a pyramidal shape.

Once the V-shaped trench is provided, memory cells (e.g., vertical NAND strings) may be formed for example with a series of conformal deposition steps of a programmable material 120, a channel material 150 and a filler material 220 in the channel, resulting in a V-shaped channel. Conformal deposition techniques include, but are not limited to, atomic layer deposition (ALD) and chemical vapor deposition (CVD).

For example, a layer of programmable material 120, e.g., a HfO$_2$ layer, may first be conformal deposited on the sloped sidewalls of the V-shaped trench 50, and optionally on the bottom of the trench 50. Alternatively, the layer of programmable material 120 may be provided by filling the V-shaped trench 50 with the programmable material 120, followed by an etch-back thereof, for instance by a high aspect ratio (HAR) etch, such that only a conformal layer remains present on the inner surface of the trench 50. In embodiments of the disclosed technology, the programmable material 120 runs all along the entire V-shaped trench 50, in the depth direction of the page. In alternative embodiments, the programmable material 120 does not run all along the entire V-shaped trench, as illustrated in FIG. 3, and as best seen in the top part thereof. The layer of programmable material 120 can be a ferro-electric layer or a stack of ferro-electric layers in case of a ferro-electric memory. However, embodiments are not so limited and the layer of programmable material 120 can be a stack of insulating/conductive/insulating layers in case of a floating gate memory. In a specific embodiment, the programmable material 120 may be a resistive switching material or a phase change switching, such that it can be implemented in a 3D resistive RAM (3D RRAM) device or a 3D phase change memory (3D PCM), respectively, or any other suitable resistive switching material.

Next, a layer of channel material 150, e.g., semiconductor material such as for instance silicon, may be conformally deposited on the layer of programmable material 120, and optionally on the horizontal bottom portion of the V-shaped trench 50, if present. Alternatively, also the layer of channel material 150 may be provided by filling the V-shaped trench 50, covered with the layer of programmable material 120, with the channel material 150, and selectively removing part of the channel material, e.g., etching it back, for instance by a high aspect ratio (HAR) etch, such that a conformal layer of channel material remains present inside the V-shaped trench on top of the programmable material 120. If the bottom portion of the channel liner 150 remains, a continuous channel liner is formed going along opposing sidewalls of the trench 50, resulting in a 'pipe-lined' memory string. If this bottom portion of the channel liner 150 is absent, e.g., by etching through the liner 150 at the bottom of the trench 50, opposing strings are not connected in series. The channel material 150 may comprise lightly doped p-type or n-type semiconductor material, e.g., having a doping level below $10^{17}$ cm$^{-3}$, e.g., polysilicon. An n-channel device, having n-type doped channel material, is preferred since it is easily connectable with n+ junctions, e.g., source and drain n+doped regions having a doping concentration between $10^{17}$ cm$^{-3}$ and $10^{21}$ cm$^{-3}$ located at the opposite ends of each channel in case no pipe-line is formed. However, a p-channel device, having p-type doped channel material, may also be used. Other semiconductor materials, e.g., Si, SiGe, SiC, Ge, III-V, II-VI, etc., may also be used.

Figure 4:
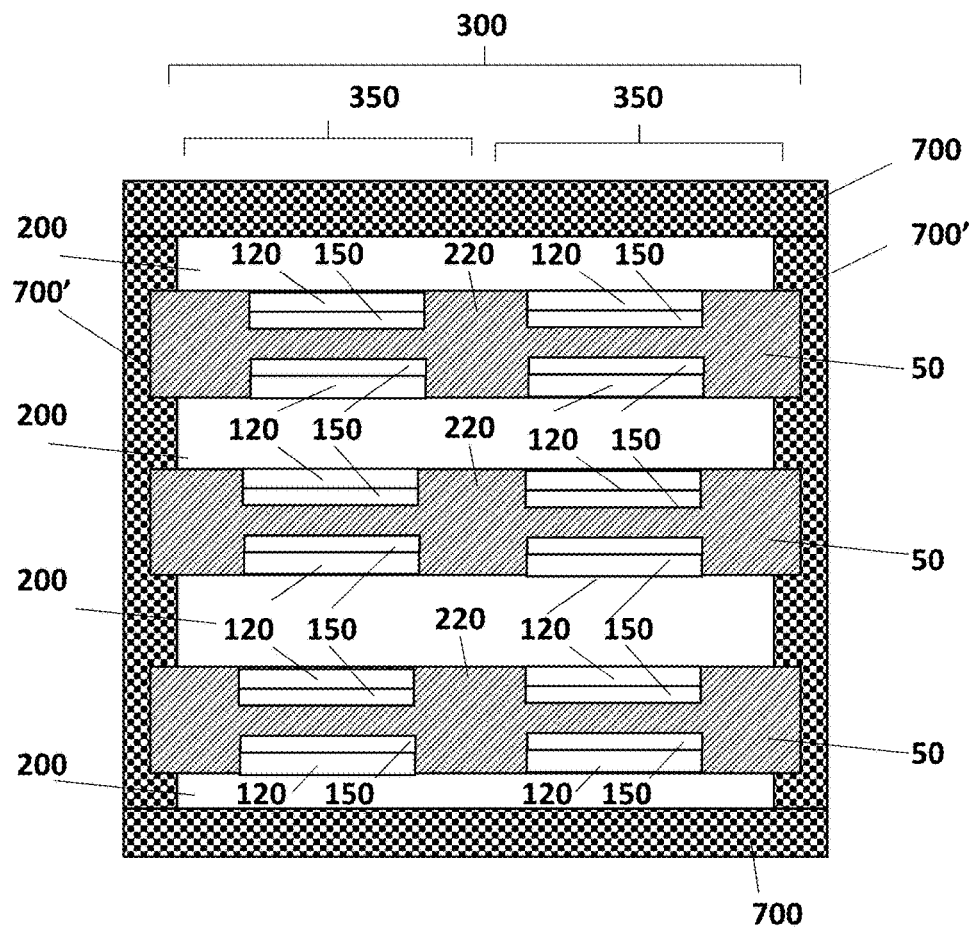
FIG. 4 illustrates a top view of a memory device comprising a memory block having multiple cell strings, each cell string having a V-shaped vertical channel, with a partial metal gate in the periphery of the memory block, according to embodiments.

After depositing the layer of channel material 150 on the layer of programmable material 120, the layer of channel material 150 may be patterned, preferably by a high aspect ratio (HAR) etch. This patterning of the layer of channel material 150 splits the channel in a plurality of shorter channels in a direction along the width of the trench 60 as illustrated in FIG. 4. In embodiments, one could optionally etch or remove the programmable material 120, e.g., HfO$_2$ layer, at the same time as the channel material liner 150. If the programmable material 120 is not conductive, it need not to be removed, as short-circuiting different cells in the same string or in adjacent strings having the trench 50 (not illustrated in FIG. 4, as it is filled there with filler material 220) in common will not occur. Hence the (second) HAR etch for patterning the channel material 150 does not have to be selective to the programmable material 120. The second HAR etch, patterning the channel liner 150, may be only selective with respect to the first 200 and second materials 210 of the stack.

In a next step, a filler material 220 is provided in the partially filled trench 50 as illustrated in FIG. 4, overlying the channel liner 150. The shape of the filler material 220 in a cross section substantially perpendicular to a main surface of the substrate 100 can be trapezoidal or triangular (with a sharp tip at the bottom and thus not comprising a horizontal part). The filler material 220 may comprise a silicon oxide layer deposited by conformal atomic layer deposition (ALD) or chemical vapor deposition (CVD). Other high-k dielectric materials, such as hafnium oxide, may be used instead or in addition to silicon oxide.

As a result, by using a V-shaped vertical trench architecture, the memory devices or memory cells are constructed along the sloped sidewalls of the trench. A filler material 220, e.g., dielectric filler such as an oxide, is used to separate and isolate the two opposing parts of the string as illustrated in FIG. 4. Instead of using a cylindrical filler as in plug-based architectures, in embodiments of the disclosed technology a pyramidal or triangular filler 220 is used which is much easier to implement in terms of filling accuracy. If there is a residual piece of the channel material 150 at the bottom of the trench 60, it connects adjacent and opposing strings thereby making a connection which is the equivalent to the much more complicated pipeline in the pipeline BiCS discussed in the prior art section: in the disclosed method a series connection is created without costing any additional area.

A minor drawback could be that the filler material 220 has to fill the trench 50 until below the last control gate 200 in the stack, to ensure that the bottom cells are still separately addressable as the channel liner 150 will be below the level of the last control gate. This can be easily resolved by providing more margin at the bottom oxide thickness separating the lowest control gate from the substrate, such that a deeper trench 50 can be formed. The electrical crosstalk between the opposing bottom cells has to be checked since they are more closely together than those at the top of the string, in view of the presence of the V-shaped trench.

Embodiments of the V-grooved vertical channel architecture of the disclosed technology can be applied to all 3D NAND and RRAM-type memories that are not relying on field enhancement. These could be used in, but not limited to, FeFET, RRAM, CBRAM, memristor or any other type of cross-point memory where the cell is constructed vertically on the chip.

As a result, the V-shaped channel according to embodiments of the disclosed technology is not for use in plug-based architectures (where tunneling is used for programming and erasing) because then the difference between the top and bottom cells in terms of program/erase speed would be too large due to the field enhancement effect. In other words, for these applications, the angle of the etch has to be very close to 90 degrees which makes a V-shape as in accordance to embodiments of the disclosed technology substantially impossible. However, if another mechanism is used (such as e.g., ferroelectric switching) that does not rely on field enhancement, the cells will not show this variation and the 'tunnel' can be replaced by a small piece of e.g., semiconductor material such as silicon at the bottom (on the horizontal portion) which comes naturally from the trench formation with a relaxed etch angle.

As was disclosed above for memory devices having a plug cell strings, one can create in-between the V-grooved memory strings slit trenches 60 to locally remove the material 200 of the gate electrode. This results in recesses 70 in the control gate layer material as the control gate layers are located in a horizontal direction with respect to the vertical slit trenches. This horizontal removal may be accomplished by selectively etching the portion of the control gate layer 200 exposed at the side walls of the slit trench 60. In particular embodiments, etching a part of the control gate layer is enabled by using an undercut etch process, wherein an anisotropic etchant is used. However, embodiments are not so limited and in other embodiments, part of the control gate layer may be etched using an isotropic etchant. As a result, the edge of the sidewalls of the slit trenches 60 has a substantially toothed profile. It is to be noted, that only a portion of the control layer, e.g., polysilicon, is selectively removed during the etching and thus that the control layers are not considered to be sacrificial or sacrificial layers. As the slit trenches form a boundary of the active memory cell area, the control layers are partially removed at the edges of the active memory cell area. An electrically conductive material is provided at least in the recess 70. The electrically conductive material may be a metal having a low resistance which is compatible with the CVD process and the control layer (e.g., polysilicon). Examples of such materials may be, without being limited thereto, tungsten, titanium, tantalum, tantalum nitride, titanium nitride or a combination of two more of these metals. The electrically conductive material may thus locally form electrically conductive control gate electrode plugs. The electrically conductive control gate electrode material is made to partially or completely fill the trenches 60, and to completely fill the recesses 70 whereby the as-deposited gate electrode material 200 remains in contact with the V-grooved channel 50, 51. The electrode material may then be removed from the trenches 70 (e.g., using anisotropic etching) without removing the material present in the recesses 70 (similar to what is illustrated in FIG. 2 for the plug embodiment).

Thus, within the active memory cell area 300, as illustrated in FIG. 2 or in FIG. 4, the stack comprises, on a major surface of a substrate 100, alternating layers of a first material layer 200 and a second material layer 210. The second material layer comprises a second insulating material, e.g., an insulating material, such as silicon oxide. The first material layer 200 comprises a conductive material, e.g., a semiconductor material, such as polysilicon, adjacent to the memory hole 50, 51 and a conductive electrode material, e.g., a metal, metal silicide or metal nitride material, such as tungsten, tungsten silicide, tungsten nitride, tantalum, tantalum nitride, titanium, titanium silicide or titanium nitride, remote from the memory hole 50, 51. The conductive electrode material forms a plurality of conductive control gate electrodes 700 at the boundary of the active memory cell area 300. In addition, the conductive gate electrode material does not extend adjacent to or contact the at least one memory film in any of the NAND memory strings 500, 501. In embodiments of the disclosed technology, the conductive electrode 700, which is in contact with the remaining material 200 of the etched-back second material layer, e.g., metal 700 in contact with polysilicon 200, which in turn provided between the conductive electrode 700 and the at least one memory cell of a NAND memory strings 500, 501.

In embodiments of the disclosed technology the conductive electrode material 700 is in contact with the remaining material 200 of the control gate, e.g., metal 700 in contact with polysilicon 200, which result in a smaller WF compared to the prior art devices having a full replacement metal gate. Such smaller WF is advantageous in Ferroelectric applications.

In embodiments of the disclosed technology, the slit trenches are provided at the boundaries of a memory block 300. As a result only the edges, e.g., outer boundaries, of the memory block comprise partially replaced gates, e.g., partially replaced metal gates. The replacement material, e.g., metal, is not present in-between the memory holes 50, 51 of that memory block 300.

FIG. 4 schematically illustrates a top view of a memory area 300, comprising 12 memory cells 350 having a V-shaped vertical channel in the 3 V-shaped trenches 50. The partial replace gate method according to embodiments of the disclosed technology is provided completely around the memory block 300, thereby replacing at the boundary of the memory block 300 the word plane 200 by another conductive material, e.g., a metal 700, 700'. After forming the memory cells 350, one or more V-trenches 60 are defined in the layer stack 200, 210, surrounding the memory block 300. Then a partial replacement gate 700, 700' is provided using embodiments of the disclosed technology, through the slit trenches 60 outlining the periphery or boundary of the memory block 300. As a result, the partially replaced conductive gates, e.g., partially replaced metal gates 700, at the periphery or edge of the memory block 300 advantageously show a lower series resistance and thus reduce the RC load of the word lines and/or word planes present within the memory block 300. As the V-grooved 50 vertical channel cuts through the word plane 200, the word plane (or word line) is interrupted, Hence V-trenches 60 are formed in a direction perpendicular to the V-grooved 50 vertical channels such that the isolated parts of the word plane 200 are electrically connected via the partial conductive gates, e.g., metal gates 700' at these sides.

Figure 5:
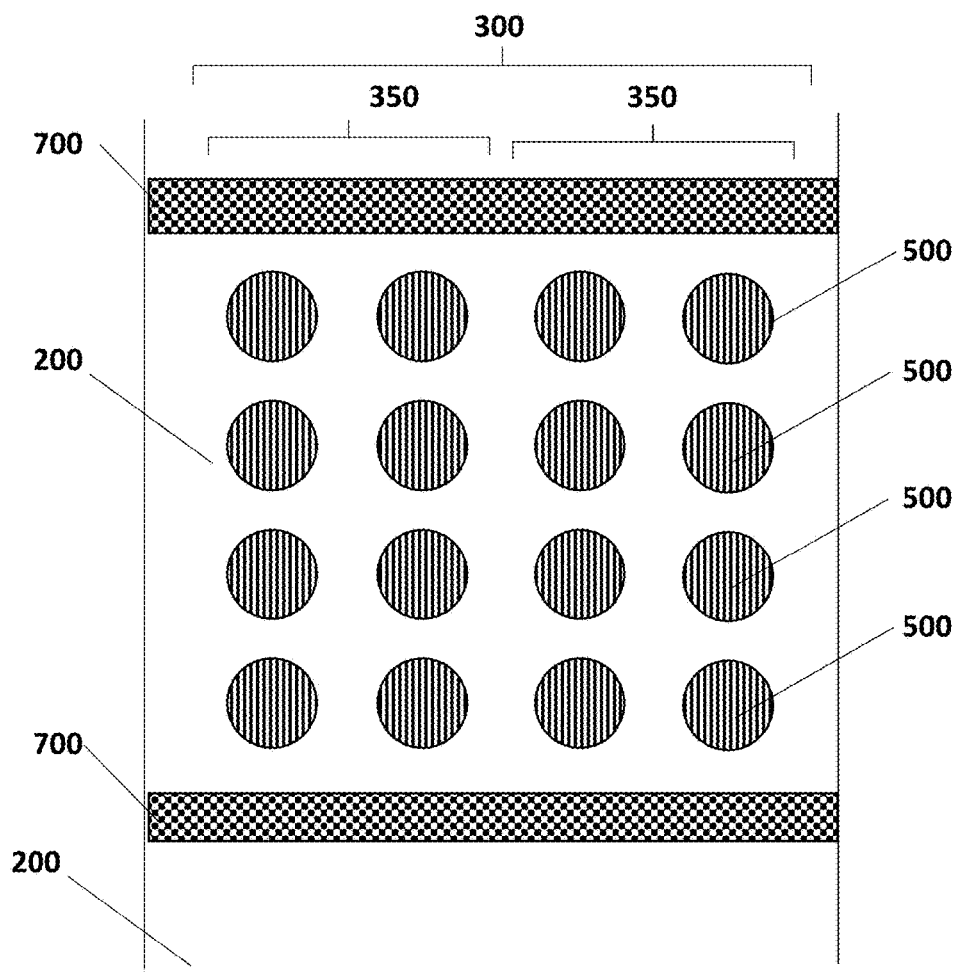
FIG. 5 illustrates a top view of a memory device comprising a memory block having multiple cell strings, each cell string having a plug vertical channel, with a partial metal gate in the periphery of the memory block, according to embodiments.

FIG. 5 schematically illustrates a top view of a memory area 300, comprising 12, memory cell 350 having a vertical channel in a plug 50. The partial replace gate method according to embodiments of the disclosed technology is provided partially around the memory block 300, thereby replacing at the boundary of the memory block 300 part of the word plane 200 by a metal for instance. After forming the memory cells 350, a V-trench 60 is defined in the layer stack 200, 210, at opposite sides of the memory block 300. Then a partial replacement gate 700 is provided using embodiments of the disclosed technology, through the slit trenches 60 outlining part of the periphery or boundary of the memory block 300. As the word plane 200 within the memory block 300 is not interrupted by the plugs 50 of the memory cell, one may choose to only have partial gate replacement, e.g., partial metal gate replacement, at part of the boundary of the memory block.

The foregoing description details certain embodiments of the disclosed technology. It will be appreciated, however, that no matter how detailed the foregoing appears in text, the disclosed technology may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

What is claimed is:

1. A method of fabricating a memory device, the method comprising:
    providing, on a substrate, an alternating stack of control gate layers and dielectric layers;
    forming a memory block, comprising forming at least one memory hole through the alternating stack, the at least one memory hole comprising on its sidewalls a sidewall stack of a programmable material, a channel material and a dielectric material, thereby forming at least one memory cell;
    removing a portion of the alternating stack to form at least one trench, wherein the trench forms at least part of a boundary of the memory block;
    partially removing the control gate layers exposed at a sidewall of the at least one trench thereby forming recesses in the control gate layers, wherein partially removing is such that remaining portions of the control gate layers are laterally interposed between the recesses and the sidewall stack; and
    filling the recesses with an electrically conductive material, thereby forming electrically conductive plugs.

2. The method of claim 1, wherein filling the recesses comprises filling the at least one trench and the recesses with the electrically conductive material, and removing the electrically conductive material from the trench while keeping the recesses at least partially filled with the electrically conductive material.

3. The method of claim 1, wherein the memory hole has sidewalls substantially perpendicular to a main surface of the substrate.

4. The method of claim 1, wherein forming the at least one memory hole comprises forming at least one V-shaped memory hole through the alternating stack.

5. The method of claim 1, wherein the at least one trench forms the boundary of the memory block.

6. The method of claim 1, wherein partially removing the control gate layers comprises selectively etching the control gate layers relative to the dielectric layers.

7. The method of claim 1, wherein filling the recesses with the electrically conductive material comprises filling with one or more of tungsten, tungsten nitride, tantalum, tantalum nitride, titanium and titanium nitride.

8. The method of claim 1, wherein the control gate layers comprise semiconductor layers, and wherein filling the recesses comprises filling with a metallic material.

* * * * *